(12) United States Patent
Giterman et al.

(10) Patent No.: US 10,811,073 B2
(45) Date of Patent: Oct. 20, 2020

(54) DYNAMIC MEMORY PHYSICAL UNCLONABLE FUNCTION

(71) Applicant: Birad—Research & Development Company Ltd., Ramat Gan (IL)

(72) Inventors: Robert Giterman, Beer Sheva (IL); Yoav Weizman, Kfar Vitkin (IL); Adam Teman, Tel Mond (IL)

(73) Assignee: Birad—Research & Development Company Ltd., Ramat Gan (IL)

(*) Notice: Subject to any disclaimer, the term of this patent is extended or adjusted under 35 U.S.C. 154(b) by 0 days.

(21) Appl. No.: 16/387,552

(22) Filed: Apr. 18, 2019

(65) Prior Publication Data

US 2019/0333567 A1    Oct. 31, 2019

Related U.S. Application Data

(60) Provisional application No. 62/662,303, filed on Apr. 25, 2018.

(51) Int. Cl.
    *G11C 11/406*    (2006.01)
    *G11C 11/402*    (2006.01)

(52) U.S. Cl.
    CPC .......... *G11C 11/406* (2013.01); *G11C 11/402* (2013.01)

(58) Field of Classification Search
    None
    See application file for complete search history.

(56) References Cited

U.S. PATENT DOCUMENTS

| | | | |
|---|---|---|---|
| 6,738,294 B2* | 5/2004 | Layman | G11C 5/00 365/154 |
| 9,425,803 B1* | 8/2016 | Duncan | H03K 19/17768 |
| 2013/0133031 A1* | 5/2013 | Fainstein | G06F 21/73 726/2 |

* cited by examiner

*Primary Examiner* — James G Norman
(74) *Attorney, Agent, or Firm* — Dekel Patent Ltd.; David Klein

(57) ABSTRACT

A method uses data retention time (DRT) characteristics of a logic-compatible gain-cell embedded DRAM (dynamic random-access memory) (GC-eDRAM) array in a transistor circuit as a source for physical unclonable function (PUF) signature extraction of the circuit.

8 Claims, 11 Drawing Sheets

|  | JSSC'08 [7] | VLSI'17 [8] | JSSC'13 [22] | DATE'15 [21] | This Work |
|---|---|---|---|---|---|
| Memory Type | SRAM | SRAM | Embedded DRAM | Embedded DRAM | GC-eDRAM |
| Technology Node | 130nm | 28nm FD-SOI | 32nm | 65nm | 28nm |
| Bit-cell Area (Normalized to 28nm) | $0.336\mu m^2$ | $0.304\mu m^2$ | $0.039\mu m^2$ | | $0.174\mu m^2$ |
| Logic Compatible | Yes | Yes | No | No | Yes |
| Bias (Fractional Hamming Distance) | 50.16% | 38% | 50% | 50.15% | 50% |
| Average Uniqueness (Inter-die Hamming Distance) | 50.1% | 48% | 50% | 50.01% | 50% |
| Tested Voltage Range | 0.9V-1.2V | 0.5V-0.9V | 0.81V-0.99V | 0.9V-1.2V | 0.4V-1V |
| BER under Voltage Variation | 5.4% | 8.1% | 10% | 14.9% | 5.2% (one indicator) 1.5% (twenty indicators) |
| Tested Temperature Range | 0°C-85°C | 0°C-80°C | 25°C-85°C | 20°C-60°C | 0°C-85°C |
| BER under Temperature Variation | 5.4% | 10.7% | 10% | 19.9% | 5.8% (one indicator) 4.8% (twenty indicators) |

FIG. 11

DYNAMIC MEMORY PHYSICAL UNCLONABLE FUNCTION

FIELD OF THE INVENTION

The present invention relates generally to cryptologic elements in electronic circuitry, such as physical unclonable functions, and particularly to a dynamic memory based physical unclonable function.

BACKGROUND OF THE INVENTION

Physical Unclonable Functions (PUFs) are important elements in hardware-secured systems, which require the generation of secret keys to encrypt data. An electronic PUF is constructed from physical data, which is very hard to clone due to unique properties that originate from the random variations inherent to the CMOS fabrication process. An electronic PUF may have:

1) Low cost—the hardware that implements the PUF may be low cost and easy to implement, optimally using standard layout design rules and components that are readily available on the applicable architecture.

2) Randomness—the PUF may originate from a source of random physical parameters, such as CMOS technology process variations, making it very difficult to clone.

3) Uniqueness—the PUF may be unique and differ from die to die, resulting in different secret keys for every instance of the specific application.

4) Reliability—the PUF may be reliable and able to reproduce the unique secret key pattern under varying operating conditions, such as temperature variations, voltage variations, and aging.

One of the popular ways to generate a PUF is using an embedded memory array implemented with SRAM (static random-access memory), which is usually available on the chip, and therefore, does not require additional hardware. Generating a PUF from an SRAM array may be done by sampling the SRAM array bits following the system start-up procedure. During power supply ramp up, each bitcell settles at one of its two stable points ('0' or '1') based on intra-die local process variations (mismatch) between transistors in each cell. Then, a challenge is applied to the SRAM using a memory address, and its response is the corresponding bit values at this address. However, SRAM start-up state is highly unstable and depends on environmental variations and aging. Therefore, repetitive bit-extraction and special algorithms are required to develop a stable bit map and eliminate unstable bits, resulting in time and area overhead. Furthermore, the power-up state of SRAM arrays depends on the previously stored data of the array, requiring long periods of time between two consecutive power-up stages to ensure independent start-up behavior. These periods can reach up to several seconds of enrollment. Various approaches to avoid the history problem have been proposed, such as connecting two SRAM bitcells with complementary data signals and simultaneously enable their wordlines.

Gain-cell embedded DRAM (GC-eDRAM) is an alternative to conventional SRAM arrays for the implementation of embedded memories, as they are fully logic-compatible, while offering higher density, less leakage, non-ratioed operation, and two-ported functionality, which are all advantageous, as compared to conventional 6-transistor (6T) SRAM. The main disadvantage of GC-eDRAM is the requirement for periodic refresh cycles to ensure data retention due to their dynamic storage nature. The data retention time (DRT) of GC-eDRAM is defined as the time after write at which data can no longer be read out correctly due to the level degradation. Level degradation occurs as a result of leakage currents to and from the in-cell capacitance, which stores the data. Therefore, the DRT is mainly affected by the amount of storage capacitance and by the leakage currents that modify its charge. These leakage currents are highly affected by process variations and especially by mismatch between transistors due to threshold voltage ($V_T$) variation. The resulting DRT distribution has been shown to be over three orders-of-magnitude for the cells of a single array in both simulations and measurements at scaled CMOS nodes. This high degree of variability is considered a disadvantage for standard memory applications.

SUMMARY OF THE INVENTION

The present invention seeks to provide a dynamic memory based physical unclonable function, as is described more in detail hereinbelow.

The invention is described below for a particular dynamic memory—a gain-cell embedded DRAM (GC-eDRAM) (dynamic random-access memory) device. However, in other aspects of the invention, the invention can be implemented in other dynamic memories, such as but not limited to, off-chip DRAM, 1-transistor 1-capacitor (1T1C) eDRAM, and other dynamic memory options.

As another example, the inventive PUF may be implemented in a 2-transistor (2T) implementation, in which the dynamic memory cell includes a write port, storage node capacitance, and a read port.

As mentioned above, the high degree of variability of GC-eDRAM is considered a disadvantage for standard memory applications. In contrast, in the present invention, this feature is surprisingly exploited for efficient PUF implementation by creating a unique, device-specific signature.

In the present invention, a PUF generation scheme is based on the DRT distribution of logic-compatible GC-eDRAM arrays. (Note that the term "logic-compatible" refers to the ability to fabricate GC-eDRAM with the same manufacturing process as standard digital logic. This is as opposed to off-chip DRAM, which requires a separate manufacturing process, or embedded DRAM, which requires special process steps that are both costly and not available in all technologies) This random feature is integrated into an authentication process that uses an indicator cell to set the data sampling time around which the array signature is extracted. It is shown that this technique provides a unique signature, which retains robustness under a wide range of operating voltages and temperatures. Compared to an SRAM-based PUF, this solution does not suffer from a "memory effect", and therefore, there is no need to keep the array in an extensive power-off state prior to evaluation. Furthermore, the inventive GC-eDRAM array can be solely composed of NMOS devices, significantly limiting errors caused by aging effects, dominated by negative-bias temperature instability (NBTI), which cause the threshold voltage of PMOS devices to vary over time.

Without limitation, some of the features described are as follows:

1) A PUF generation scheme based on a logic-compatible GC-eDRAM array.

2) The GC-eDRAM based PUF bitcell area may be 50% smaller than the area of an SRAM based PUF bitcell in the same technology.

3) An in-depth analysis of the leakage mechanisms of GC-eDRAM under process and temperature variation is provided to show their effect on the DRT of the array.

4) An enrollment and evaluation algorithm is presented for the ID extraction based on the DRT of a GC-eDRAM array.

5) The robustness of the methodology of the invention is shown across a wide range of temperature and voltage variations, ranging from 0° C.-85° C. and 0.4 V-1 V, respectively.

BRIEF DESCRIPTION OF THE DRAWINGS

The present invention will be understood and appreciated more fully from the following detailed description taken in conjunction with the drawings in which:

FIG. 11 is a table showing a comparison between the GC-eDRAM based PUF of the invention and prior art memory-based PUFs, including SRAM and DRAM.

DETAILED DESCRIPTION OF EMBODIMENTS

2T GC-EDRAM Structure and Operating Principle

Figure 1A:
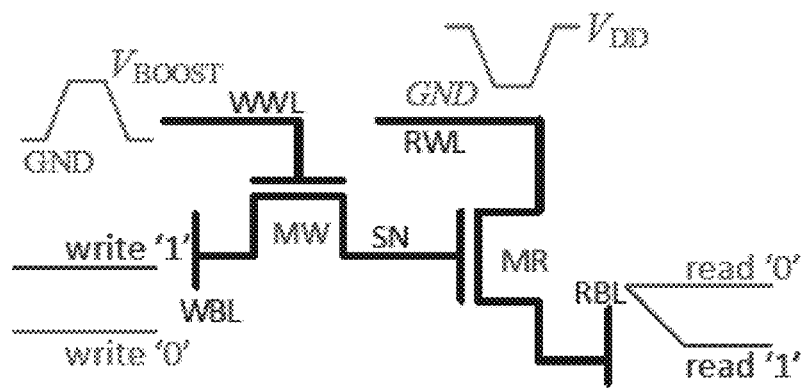
FIG. 1A is a simplified circuit diagram of a GC-eDRAM circuit including a 2T gain cell, having a write transistor (MW) and a read transistor (MR), in accordance with an embodiment of the invention.

Reference is now made to FIG. 1A, which illustrates a 2T gain cell, featuring a write transistor (MW) and a read transistor (MR). This structure offers the highest density among different GC-eDRAM topologies. The write and read transistors of the 2T gain cell can be implemented with either PMOS or NMOS devices with different threshold voltages, trading off leakage, access speed, and area requirements. The illustrated embodiment is an all-NMOS version, implemented with minimal sized and standard-$V_T$ devices.

Figure 1B:
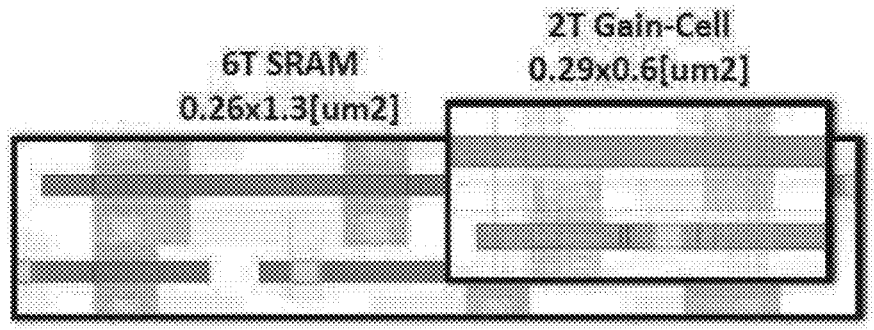
FIG. 1B is a simplified comparison of the layout views of the GC-eDRAM bitcell of FIG. 1A and a conventional 6T SRAM.

FIG. 1B is a comparison of the layout views of the GC-eDRAM bitcell of FIG. 1A and a conventional 6T SRAM, drawn with standard design rules in 28 nm technology. The 2T GC-eDRAM bitcell is measured at 0.29 μm×0.6 μm (0.174 μm$^2$), which is 50% smaller than the area of a 6T SRAM bitcell.

Figure 1C:
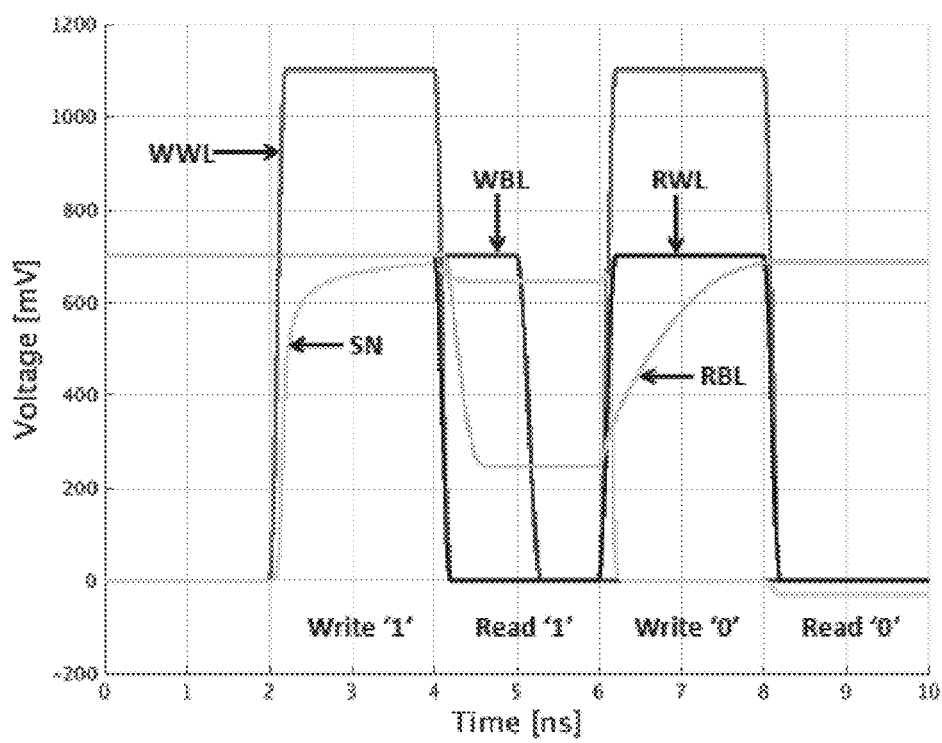
FIG. 1C is a simplified waveform demonstration of consecutive write and read operations of the GC-eDRAM circuit.

In the GC-eDRAM topology of the invention, the write operation is performed by charging the write wordline (WWL) to a boosted voltage (VBOOST) to overcome the $V_T$ drop when discharging the storage node (SN) during a write '0' operation, and transferring the voltage level set by the write bitline (WBL) to SN. For read operations, the read bitline (RBL) is pre-charged to $V_{DD}$ and the read wordline (RWL) is pulsed to GND. When the bitcell stores a logic '0', MR will be cut off and RBL will remain charged. On the other hand, if data '1' is stored, MR will turn on and RBL will be discharged past a read threshold. For clarity, these signals are illustrated in FIG. 1C.

It is important to note that the GC-eDRAM relies on a dynamic storage mechanism, meaning that a parasitic capacitance is charged or discharged during a write operation and this charge is subsequently disconnected from any power supply by high resistance paths, such as the cut-off channel of MW and the gate capacitor of MR. However, the finite resistance of these paths results in leakage currents that slowly change the initial amount of charge stored in the capacitor, thereby deteriorating the stored data level. For the circuit of FIG. 1A, the fastest deterioration occurs when the WBL bias is opposite of the stored SN level, and previous work has shown that for an NMOS MW, the worst-case is for a stored logic '1' with WBL biased at GND. The duration of maintaining such a bias on a certain cell can be controlled, however, the majority of the DRT analysis assumes a constant bias at such a worst case. In one embodiment, this characteristic will be utilized to derive a device specific signature for a given array.

DRT Analysis

The DRT of GC-eDRAM arrays is important in the design of these memories, as it sets the refresh frequency of the array, as well as the retention power associated with it. The DRT of GC-eDRAM arrays is usually set by the first cell that fails, ensuring that a refresh operation is applied before any loss of data. However, in contrast, in the present invention, for the generation of a PUF based on the retention of the GC-eDRAM array, a portion (without limitation, approximately half) of the cells lose their data, in order to construct a unique and un-biased signature. Therefore, it is important to analyze the random spread of DRT across the entire memory array based on the underlying physical leakage mechanisms inherent to the circuit.

2T Gain Cell Leakage Mechanisms

The worst-case data deterioration of the all-NMOS 2T GC-eDRAM cell occurs when WBL is driven to the opposite level of the data stored in the cell. During signature extraction, we have control over both the initialization state of the array and the bias level of WBL, and therefore, for the remainder of this section, we will assume such a worst-case condition applied to the bitcell.

Figure 2A:
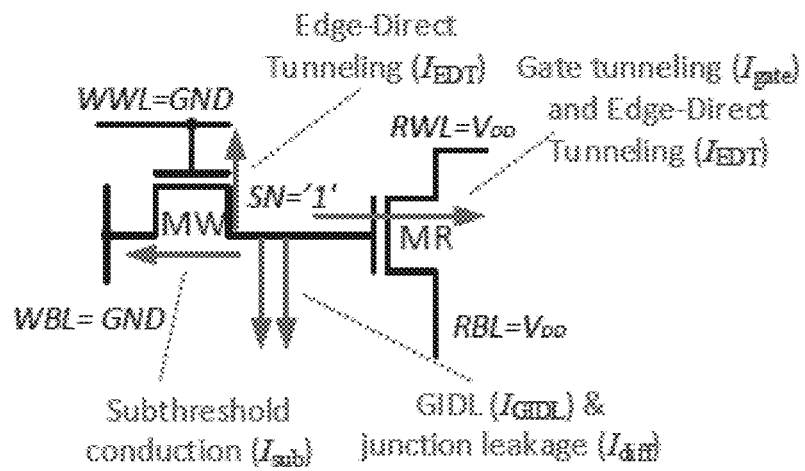
FIGS. 2A-2B are simplified illustrations of the various leakage paths that contribute to deterioration of the SN level of the GC-eDRAM circuit.
Figure 2B:
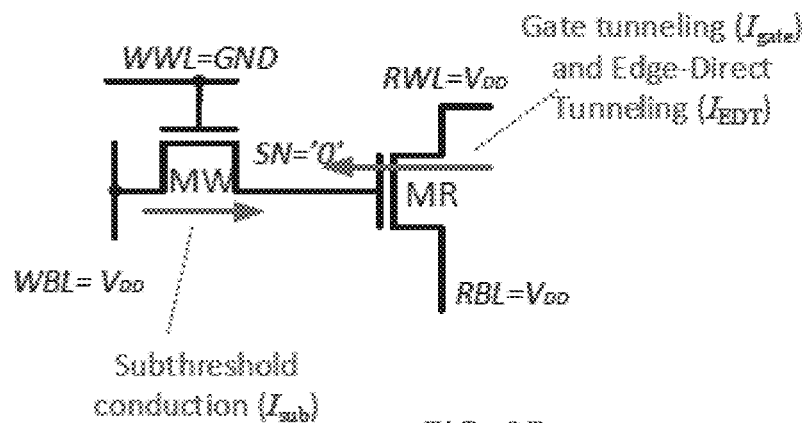

FIGS. 2A-2B illustrate the various leakage paths that contribute to the deterioration of the SN level under the aforementioned worst-case bias conditions. These leakage currents include reverse-biased pn-junction leakage ($I_{diff}$), gate-induced drain leakage ($I_{GIDL}$), gate tunneling leakage ($I_{gate}$), edge-direct tunneling current ($I_{EDT}$), and sub-threshold conduction ($I_{sub}$). $I_{sub}$ is the most dominant leakage component, charging SN when the cell stores '0' (FIG. 2(a)), or discharging it when storing '1' (FIG. 2(b)). The bulk-to-drain leakages ($I_{diff}$ and $I_{GIDL}$) weaken a logic '1' and strengthen a logic '0'. During standby, MW is always off and has no channel; therefore, forward gate tunneling ($I_{gate}$) from the gate into the channel region and into the two diffusion areas that would occur in a turned-on MOS device is of no concern here. Only the edge-direct tunneling current, to the diffusion connected to the SN in the absence of a strongly inverted channel, compromises data integrity.

The only leakage through MR that affects the stored data level is gate tunneling. During standby, there is no channel formation in MR, no matter what the stored data level is. Both RWL and RBL are driven to $V_{DD}$ during standby, such that even a logic '1' level results in zero gate overdrive. In this case, both diffusion areas of MR are at the same potential as the SN, eliminating tunneling currents between the diffusions and the gate ($I_{EDT}$=0). However, tunneling might occur from the bulk directly into the gate of MR ($I_{gate}$), dis-charging a logic '1'. If the same cell stores a logic '0', tunneling between the bulk and gate is avoided ($I_{gate}$=0), while reverse tunneling from the gate ($I_{EDT}$) into the diffusions can weaken the logic '0' level.

Figure 3A:
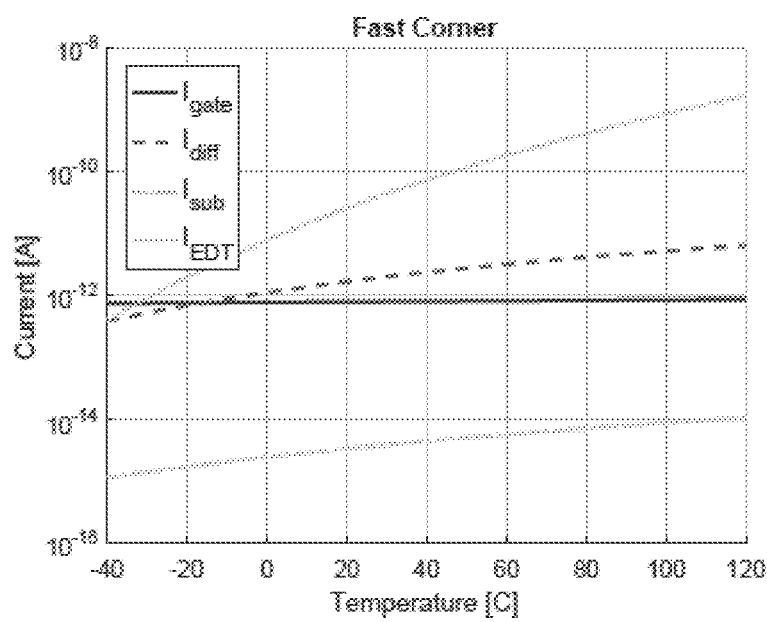
FIGS. 3A-3C are simplified illustrations of the magnitude of each leakage current with respect to temperature at different process corners simulated under a nominal supply voltage of 900 mV.
Figure 3B:
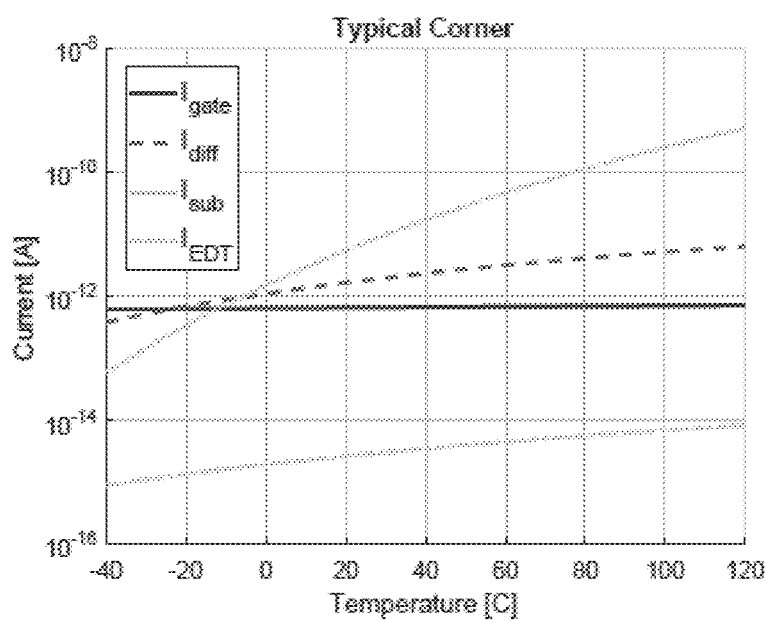
Figure 3C:
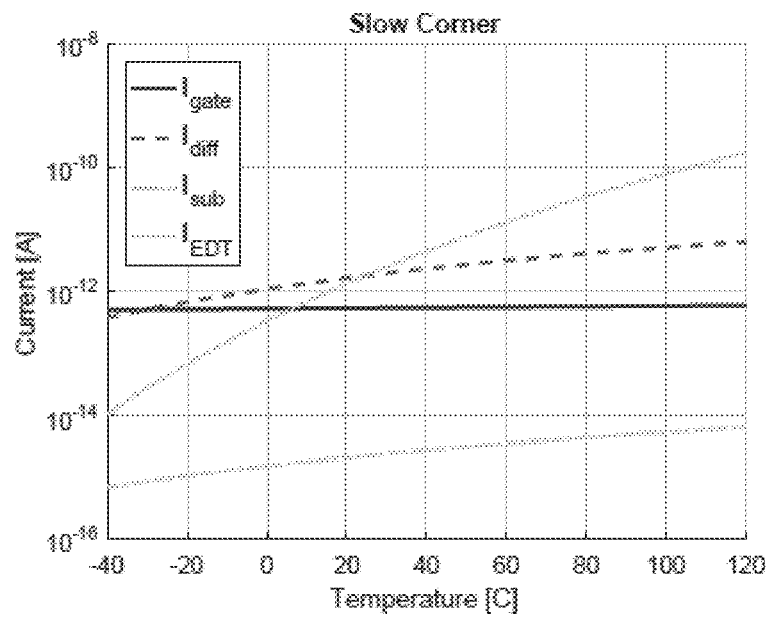

FIGS. 3A-3C illustrate the magnitude of each leakage current with respect to temperature at different process corners simulated under a nominal supply voltage of 900 mV. At very low temperatures, sub-threshold leakage is very low, causing bulk leakage the temperature independent gate leakage to be the dominant leakage factors. However, sub-threshold conduction quickly overtakes gate and bulk leakage and becomes the dominant leakage factor at higher temperatures.

Figure 4A:
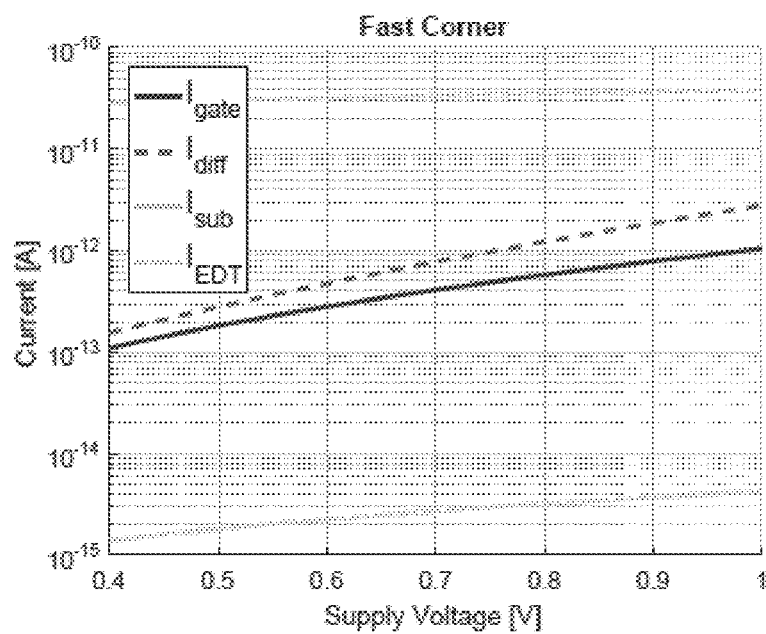
FIGS. 4A-4C are simplified illustrations of the magnitude of the leakage components with respect to supply voltage at different process corners simulated at room temperature.
Figure 4B:
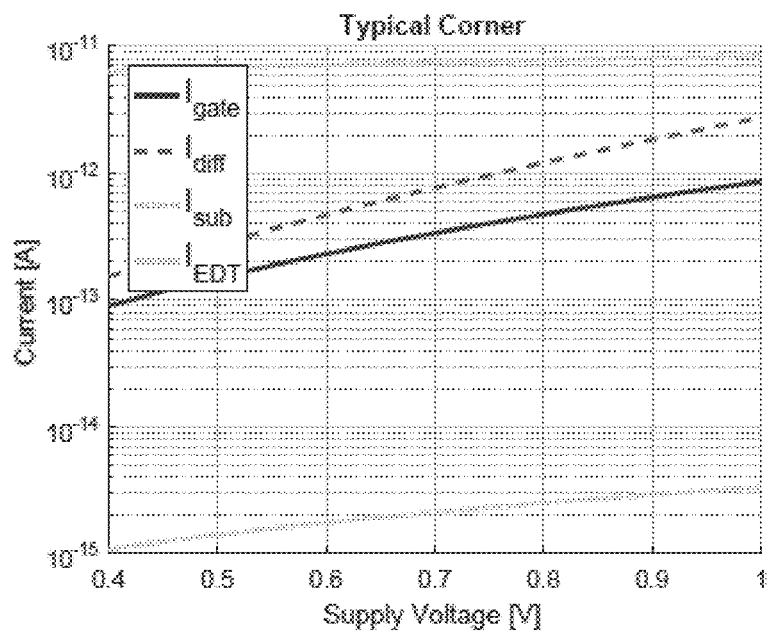
Figure 4C:
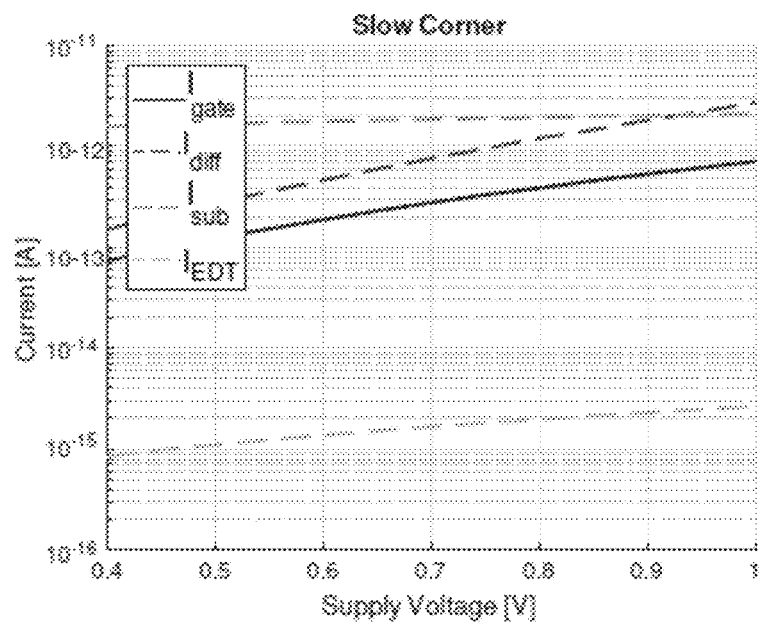

FIGS. 4A-4C illustrate the magnitude of the leakage components with respect to supply voltage at different process corners simulated at room temperature. Sub-threshold conduction also has the highest dependence on the process corner due to $V_T$ variation. Therefore, at a fast corner, $I_{sub}$ has one order-of-magnitude higher leakage than at a typical corner and two orders-of-magnitude higher leakage than at a slow corner. While all leakage components increase with supply voltage, the relation between them is kept throughout the entire voltage range, with the exception of sub-threshold and diffusion leakages at a slow corner, where the latter exceeds the first at close-to-nominal voltages.

Based on these results and according to N. Edri, P. Meinerzhagen, A. Teman, A. Burg, and A. Fish, "Silicon-proven, per-cell retention time distribution model for gain-cell based eDRAMs," *IEEE Transactions on Circuits and Systems I: Regular Papers*, vol. 63, no. 2, pp. 222-232, 2016, we can conclude that the DRT of GC-eDRAM is mainly affected by sub-threshold leakage which modifies the charge stored on the storage capacitor. $I_{sub}$ is modeled according to the well-known EKV sub-threshold current equation [Y. Cheng, M. Chan, K. Hui, M.-c. Jeng, Z. Liu, J. Huang, K. Chen, J. Chen, R. Tu, P. K. Ko et al., "BSIM3v3 manual," *University of California, Berkeley*, 1996]:

$$I_{sub} = \frac{W}{L} I_{S0} \left(1 - e^{\frac{-V_{DS}}{\phi_t}}\right) e^{\frac{V_{GS}-V_T}{n\phi_t}}; I_{S0} = \mu_0 \sqrt{\frac{q\epsilon_{si}N_{ch}}{2\phi_s}} \quad (1)$$

where W and L are the device width and length, respectively; $V_{DS}$ and $V_{GS}$ are the drain-to-source and gate-to-source voltages, respectively; $\phi_t$ is the thermal voltage; $V_T$ is the threshold voltage; and n is the sub-threshold swing coefficient.

Furthermore, q is the electric charge, µ0 is the mobility at nominal temperature, $N_{ch}$ is the channel doping concentration, and $\phi_s$ is the surface potential. This equation shows that $I_{sub}$ is exponentially dependent on $V_T$. Since the threshold voltage of each device is susceptible to random dopant fluctuations (RDF), this results in a wide distribution of DRT, even for adjacent bitcells.

DRT Analysis

According to Edri et al., the estimated DRT (EDRT) of 2T GC-eDRAM arrays follows a log-normal distribution, and its coefficients can be expressed as follows:

$$EDRT \sim \quad (2)$$
$$\left[\log N\left(\frac{1}{n\phi_t}\mu(V_T) + \ln\left(\frac{[V_{SN}(EDRT) - V_{SN}(t_0)]C_{SN}L}{WI'_{s0}\exp\left(\frac{V_{GS}}{n\phi_t}\right)}\right)\right), \left(\frac{\sigma(V_T)}{n\phi_t}\right)^2\right].$$

$$\text{with: } I'_{s0} = I_{s0} e^{-\frac{V_{off}}{n\phi_t}}, \quad (3)$$

where $\mu(V_T)$ and $\sigma(V_T)$ are the mean and the standard variation of the write transistor threshold voltage, respectively; $V_{SN}$(EDRT) and $V_{SN}$($t_0$) are the storage node voltages at the end and beginning of the retention period, respectively; $C_{SN}$ is the storage node capacitance; $V_{GS}$ is the gate-to-source voltage on the N-type write transistor; and $V_{off}$ is the off voltage of a transistor.

Systematic variations of the manufacturing process (e.g., gradients in oxide thickness) can result in EDRT variations between dies due to their effect on the $V_T$ of all the transistors on the die. Local variations, such as W and L variations between devices, add to the variation of the EDRT between memory cells, resulting in enhanced uniqueness for the GC-eDRAM-based PUF, as explained in the following section.

Figure 5:
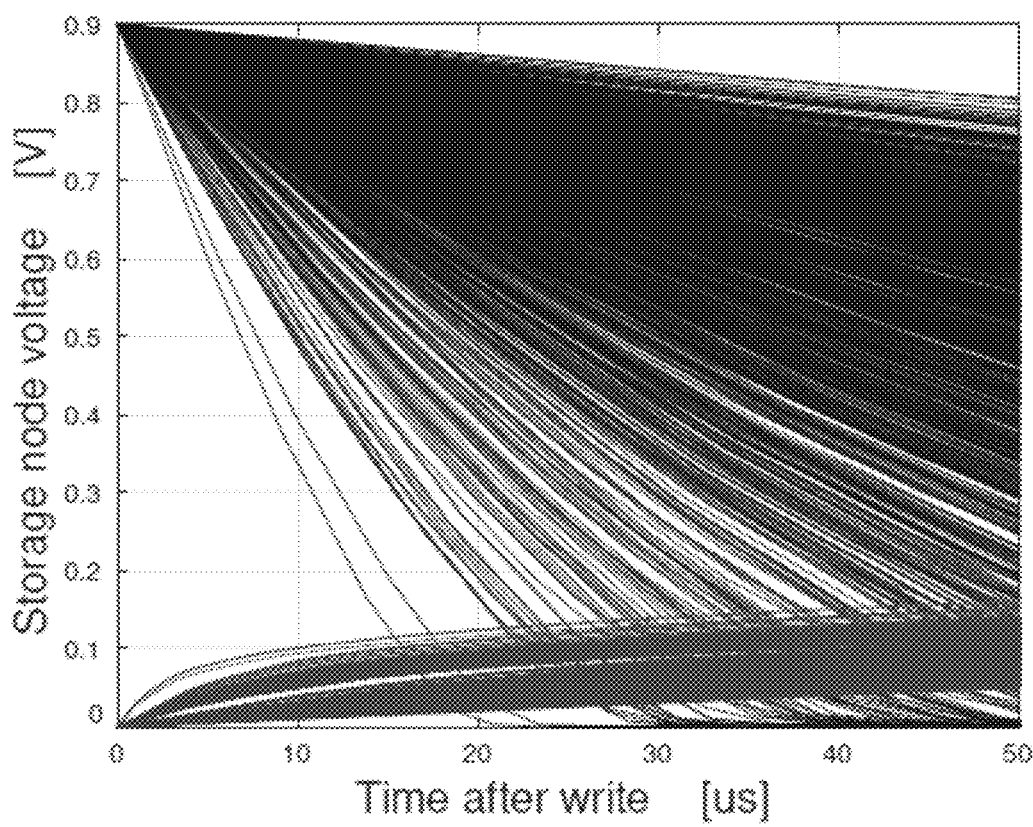
FIG. 5 is a data degradation plots under worst-case biasing conditions for both '1' and '0', as extracted from 1k Monte Carlo (MC) statistical simulations, modeling both process variations and device mismatch.

For the selected gain cell topology (specifically when using an NMOS MW) the leakage components affecting the data deterioration rate can differ depending on the data stored in the cell. This is demonstrated in FIG. 5, showing the data degradation plots under worst-case biasing conditions for both '1' and '0', as extracted from 1k Monte Carlo (MC) statistical simulations, modeling both process variations and device mismatch. Data '1' deteriorates much faster than data '0', and is therefore considered as the limiting bitcell state for determining the DRT.

Data degradation plots, such as those of FIG. 5, are often used to estimate the retention time of the array by taking the minimum difference between data '1' and '0' at a given threshold, where it is estimated that the data can no longer be read out correctly. However, for PUF purposes, we are not interested in the worst-case cell with the lowest DRTs, but rather the median failing cell, to achieve a state at which 50% of the bitcells that were initialized at '1' have flipped, as explained in Section V. It is important to note the deterioration rate is characterized by a very large spread, indicating that the PUF generated from the DRT of a 2T GC-eDRAM array can be highly unique. This will be demonstrated in the following sections.

Authentication Methodology

In one embodiment, the authentication methodology for a PUF is realized with a 2T GC-eDRAM array is based on the DRT characteristics of the array. It was shown above that a 2T GC-eDRAM array has a wide spread of data degradation rate, based on the leakage characteristics of each cell, which are a function of random process parameters that cause mismatch between the different cells in the array. Global process parameters, as well as temperature and supply voltage variations, also add to the uncertainty and instability of the array's DRT.

Without limitation, the DRT spread of GC-eDRAM arrays lacks a systematic pattern and is mainly caused by RDF which alternates the $V_T$ of the write transistor. Therefore, the DRT of the bitcells in the array can be considered uncorrelated.

One approach of this methodology is to initialize the array to a predetermined data level and subsequently apply biasing conditions that ensure data failure after a finite amount of time that exceeds the DRT of the array. If readout is applied sometime after data starts to fail, but before the entire array has exceeded its DRT, a unique signature, based on the random characteristics of the DRT, can be obtained. For the proposed 2T NMOS GC-eDRAM array, it is clear that since data '0' deteriorates much faster than data '1', by initializing the entire array at '0', and driving all the WBLs to $V_{DD}$, a failure rate that can be roughly extracted from FIG. 5 will be ensured. Reading out the array after exactly 50% of the bits fail ensures an unbiased PUF, as it will be constructed of an equal number of ones and zeros.

The following subsections describe the proposed authentication methodology, which can be realized using a simple scheme with a single indicator cell, or a more robust scheme, with k indicator cells.

Single Indicator Cell Scheme

Recall that a PUF signature may be consistent throughout the entire range of operation for a given chip, and therefore the authentication methodology may be able to provide the same signature under varying temperatures and voltages. Accordingly, it would not be useful to use a pre-determined time at which data is sampled following array initialization, as temperature and voltage variations would result in different signatures each time due to a varying DRT rate. Hence, the first step in the proposed algorithm is to find the cell that resides exactly in the middle of the DRT range of the array. Then, this cell can be used as an indicator for dynamically setting the sampling time of the array based on the operating conditions. This indicator can be realized by constantly sampling the array and using a counter to determine when exactly 50% of the array has exceeded its DRT. While the DRT of the entire array can be shifted due to globally varying parameters, it is assumed, and later demonstrated, that local variations between the DRT of cells on the same chip remain almost completely constant, and by removing the small number of unstable bits, the same signature can be obtained under all operating conditions.

Figure 6A:
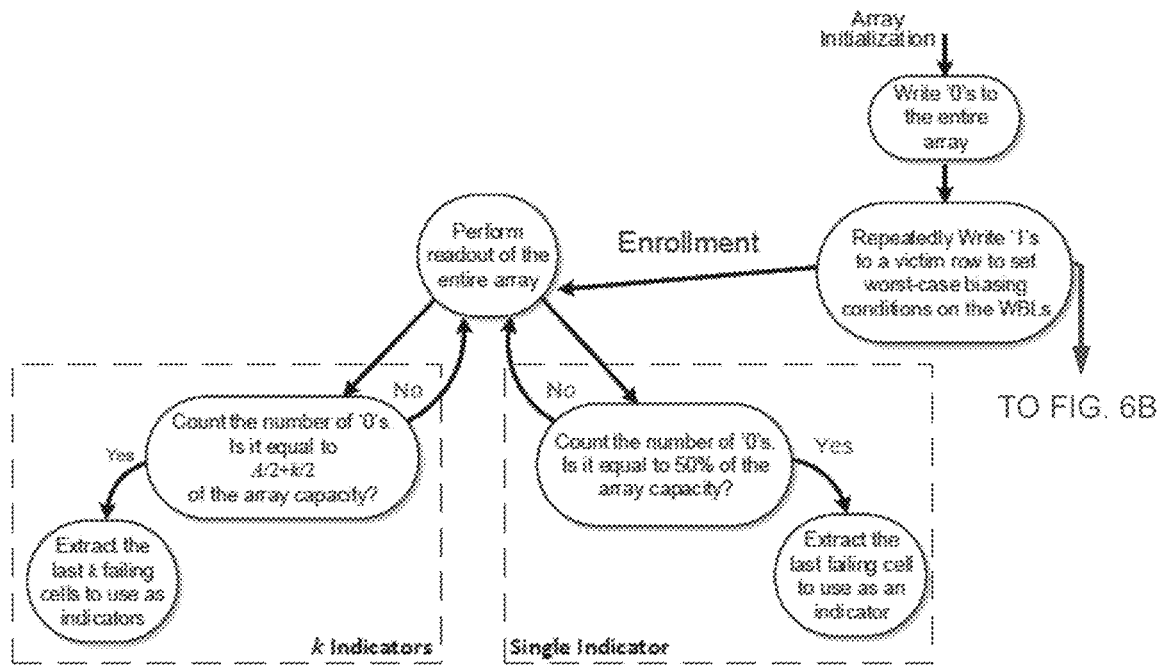
FIGS. 6A-6B together form a flow chart of the authentication methodology in accordance with an embodiment of the invention.
Figure 6B:
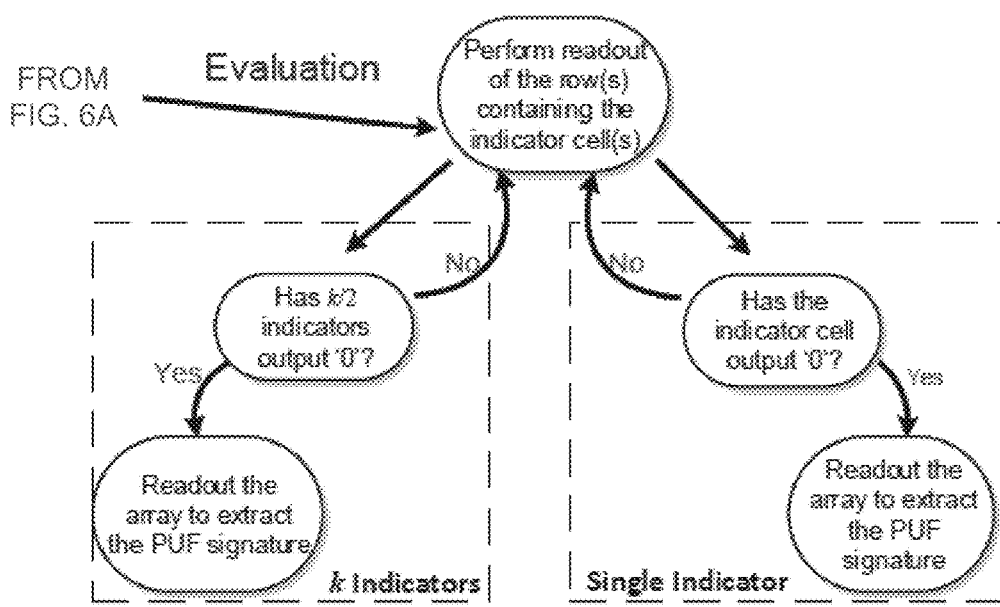

The authentication methodology of one embodiment is demonstrated in the flow diagram of FIGS. 6A-6B. It consists of two stages, the enrollment stage and the evaluation stage. During the enrollment stage, the indicator cell that represents the middle range of the array's DRT needs to be found. This is done by initializing the array to ones and applying worst-case biasing conditions by driving the write bit-lines to GND. This can be achieved without any special control signal by selecting a "victim" row and continuously applying a write '0' operation to this row (note that this row will not be included in the array signature). The array is then continuously sampled at pre-determined time steps and the number of '0' bits is counted, as these are bits that have flipped and therefore exceeded their DRT. Once exactly 50% of the cells are '0', the cell which failed last is extracted and used as an indicator for the evaluation of the PUF authentication pattern during later stages. The total enrollment time follows the array's DRT, which is on the order of a few tens of microseconds.

The evaluation stage is very similar to the enrollment stage with the exception that only the row that stores the indicator cell is constantly sampled, rather than the entire array. This results in reduced power and time overhead. After the entire array is initialized to '1', the bit-lines are driven to GND and the indicator cell is read until it outputs '0'. Subsequently, the array is read and evaluated.

Note that the proposed PUF authentication is resilient to side-channel attacks, such as data snooping, physical invasion, and machine-learning based attacks, as the generated PUF signature is based on the DRT of every cell in the array, which cannot be extracted without knowledge of the exact operating conditions, and the intrinsic characteristics of the array.

Extension to a k-Indicator Scheme

The proposed authentication methodology may rely on a single indicator cell. As such, it may be susceptible to soft errors which can alternate the DRT of the indicator cell and result in an incorrect enrollment. Furthermore, a single indicator scheme may be more susceptible to voltage and temperature variations.

To provide a more robust authentication methodology, several cells can be used as indicators. In general, k indicator cells can be used to set the enrollment and evaluation timings, providing a higher robustness to soft errors and temperature/voltage variations. The evaluation and enrollment stages for a k-indicator scheme are demonstrated in FIGS. 6A-6B. During enrollment, the array is sampled and the number of '0' bits is counted. When the number of '0' bits equals A/2+1k/2J, where A is the number of bits in the array and k is the number of indicator cells, the last k failing cells are used as indicators. During evaluation, the rows containing the indicator cells are read, until 50% of the indicator cells (rounded down) output '0'.

Figure 7A:
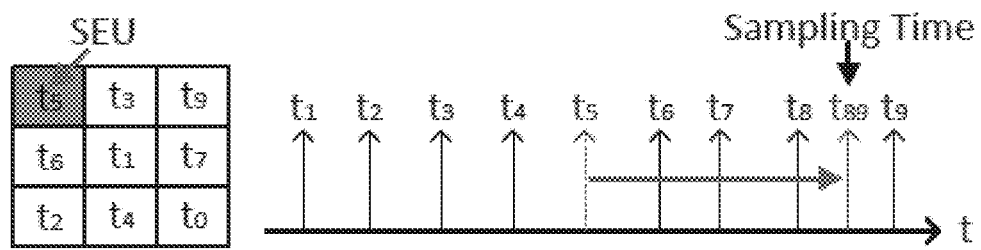
FIGS. 7A-7B are illustrations of the effect of a soft error on the output of the PUF signature for one and three indicator schemes, respectively.
Figure 7B:
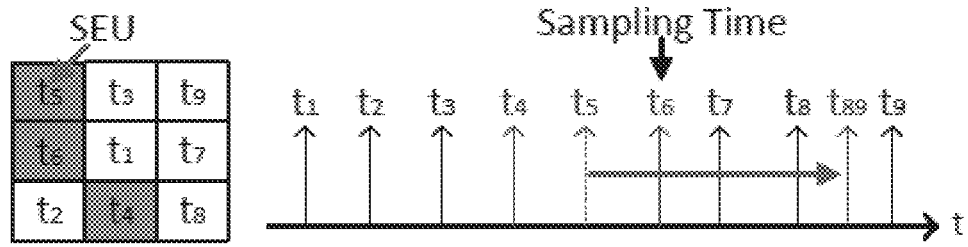

The robustness of the k-indicator scheme to soft errors is demonstrated in FIGS. 7A-7B, showing the effect of a soft error on the output of the PUF signature for one and three indicator schemes, respectively. The figures demonstrate a 3×3 memory array with a random bit failing order, denoted by $t_x$, and a time axis with qualitative time steps, which correspond to the DRT failure of each bit. For a single indicator scheme, the middle failing cell (i.e., $t_5$) is used as the indicator (marked in blue). An SEU which occurs on an indicator cell during evaluation shifts its DRT to a different position with respect to the other bits in the array. FIG. 7A demonstrates an SEU which shifts the failure time of the indicator cell from $t_5$ to $t_{89}$. Therefore, the array is sampled between $t_8$ and $t_9$, and results in 3 erroneous bits (corresponding to $t_6$, $t_7$, $t_8$). On the other hand, the three-indicator scheme (demonstrated in FIG. 7B) maintains its original signature despite an SEU that occurs in one of the indicators, as the sampling time of the array is set to the second failing indicator, which occurs at $t_6$.

Note that the k-indicator scheme incurs additional hardware as compared to a single indicator. An additional counter is required during evaluation in order to find the time when k/2 indicators have failed, and k−1 additional registers are needed to keep the address of the selected indicators following enrollment.

Simulation Results

In order to demonstrate the operation of the proposed GC-eDRAM based PUF, a 1 kbit (1024 bit) 2T NMOS GC-eDRAM array with regular-$V_T$ transistors was implemented in a state-of-the-art 28 nm CMOS process. The following subsections will elaborate upon the simulation results of the PUF signature.

Uniqueness

Recall that one of the requirements of a PUF is that it may be unique and differ from die to die, resulting in different secret keys for every instance. The most common approach to quantify uniqueness of a PUF is through computation of the inter-die Hamming distance (IHD). Ideally, the IHD is equal to 50%, which indicates that the PUF is completely unbiased and each cell has the same probability to output either '1' or '0'. To extract the IHD of the proposed PUF, 1000 MC simulations were run on the 1 kbit GC-eDRAM array to find the DRT of each cell. Each MC simulation was run at a different global corner to model different dies, and each simulation also contained mismatch variation modeling between the cells in the array.

Figure 8:
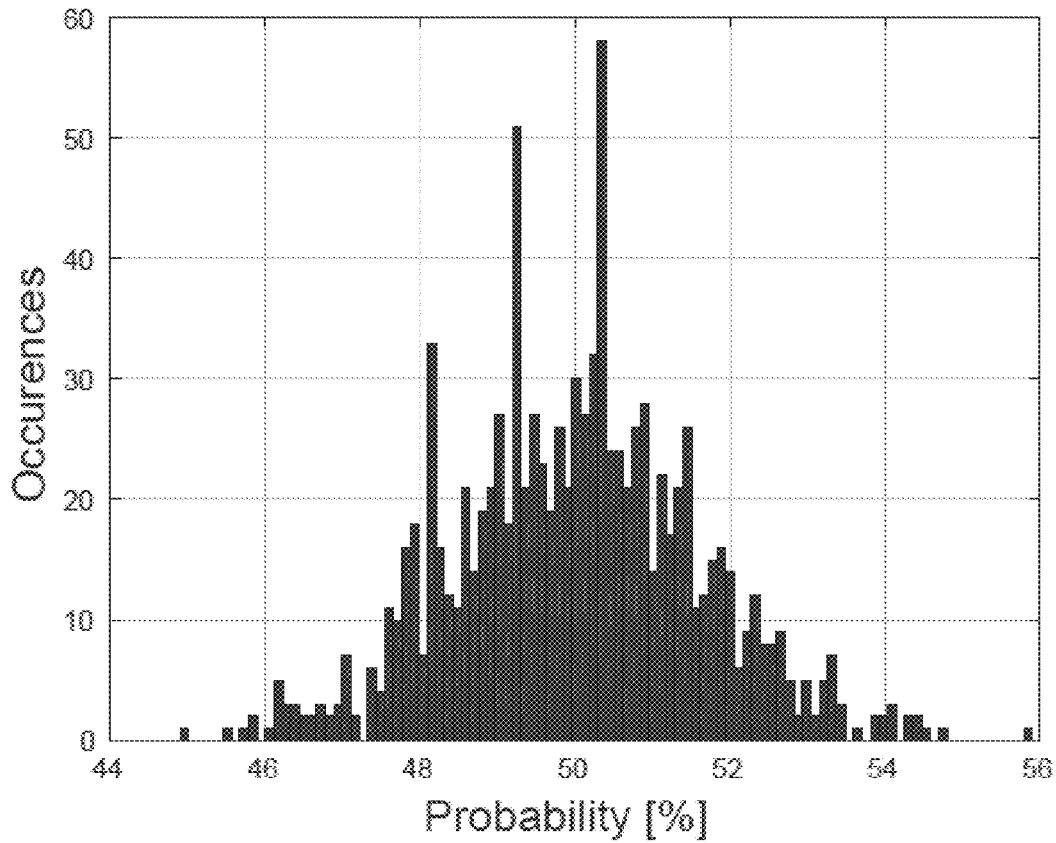
FIG. 8 is an illustration of the resulting probability of every cell in the array to produce a '0' based on the authentication methodology of one embodiment of the invention.

In the proposed authentication methodology, we quantify the cells with DRT above the median as '1', since they retain their data at the sampling time, which is set by the middle failing cell. Accordingly, the cells with DRT below the median are quantified as '0', since they lose their data (flip from '1' to '0') prior to the sampling time. FIG. 8 shows the resulting probability of every cell in the array to produce a '0' based on the proposed authentication methodology. This distribution results in the ideal average of 50% and a standard deviation of 15.9, proving the un-biased uniqueness of the PUF. The minimum and maximum probabilities were found to be 44.9% and 55.9%, respectively. Note that for a higher number of samples, it is likely to have a lower standard deviation and an even more ideal result.

Reliability

To analyze the reliability of the proposed methodology, we may consider the DRT of each cell in the array under temperature and process variations. These are often referred to as intra-die variations and can be quantified using the intra-die Hamming distance. The following analysis demonstrates the reliability of the proposed PUF for authentication schemes including one, ten, and twenty indicator cells. As discussed above, increasing the number of indicator cells reduces the PUF susceptibility to soft errors, which can possibly change the retention time of an indicator cell, resulting in a wrong authentication. Moreover, by choosing the middle failing indicator cell in each evaluation stage, the bit-error-rate (BER) of the PUF can be reduced with a higher number of indicator cells.

Supply Voltage Variation:

To quantify the reliability of the proposed PUF under supply voltage variation, the DRT of the implemented array was extracted at supply voltages ranging from the sub-threshold region (0.4 V) to a strong inversion voltage of 1 V.

The first step of this quantification was to extract the indicator cells from a MC run at the nominal supply voltage of 0.9 V. Subsequently, MC runs were applied at the full range of supply voltages to find the DRT of each cell in the array. The DRT of each of the cells was then compared to the DRT of the middle indicator cells at each voltage to see if it retained its '1' or '0' quantification from the nominal voltage run (i.e., if its DRT was still longer or shorter than the middle failing indicator cell at each voltage). A cell that changed its quantification is considered an error.

Figure 9:
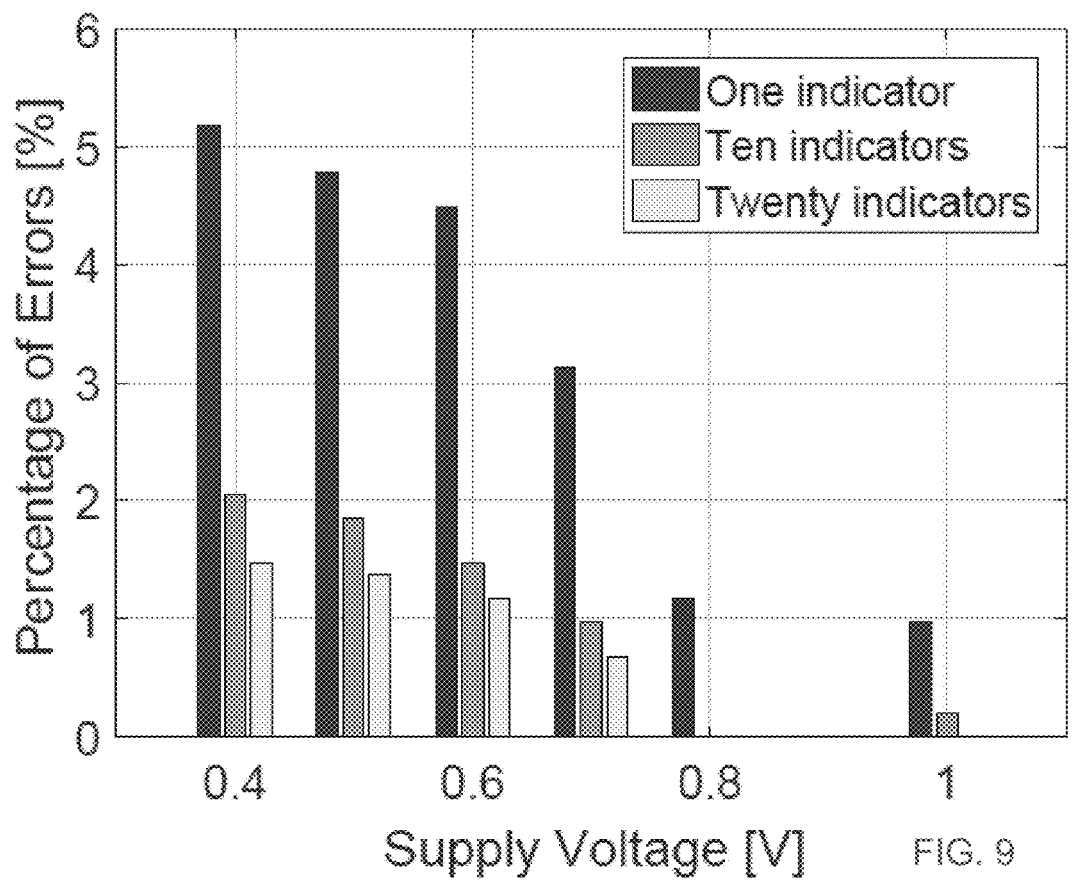
FIG. 9 is an illustration of the simulation results, showing the percentage of cells with an opposite quantification in comparison to the nominal voltage conditions for one, ten, and twenty indicator cells.

FIG. 9 presents the simulation results, showing the percentage of cells with an opposite quantification in comparison to the nominal voltage conditions for one, ten, and twenty indicator cells. The maximum number of errors was found at the lowest operating voltage of 0.4 V for every number of indicator cells. Authentication with a single indicator resulted in 54 flipped cells, which is slightly over 5% of the array capacity. By increasing the number of indicators to ten and twenty, the number of errors reduces by more than half, with only 21 and 15 errors at 0.4 V, respectively.

The results indicate that the number of errors increase as the supply voltage difference from the nominal voltage (0.9 V) increases. This can be attributed to the variation in leakage components, as discussed above. Recall that some leakage currents become more dominant in relation to others, causing the DRT characteristics of some cells to change due to higher or lower leakage sum compared to the indicator cell. Specifically, $I_{diff}$ and $I_{gate}$ are reduced by almost one order-of-magnitude between 0.9 V to 0.4 V, while $I_{sub}$ stays almost unchanged. Therefore, increasing the voltage from 0.4 V to 0.9 V can result in $I_{diff}$ and $I_{gate}$ surpassing $I_{sub}$ in cells where the write transistor has a high-$V_T$ due to mismatch. On the other hand, cells in which the write transistor has a low-$V_T$ remain dominated by $I_{sub}$ despite the increase in gate and diffusion leakages. As a result of this phenomena, the error rate changes as some leakage currents (e.g., $I_{diff}$) compensate the voltage at SN to the level where the DRT of these cells surpasses the DRT of the indicator cell, resulting in a wrong quantification.

Temperature Variation:

To quantify the reliability of the proposed PUF under temperature variation, the DRT of the implemented array at a nominal supply voltage of 900 mV was extracted for temperatures ranging from 0° C. to 85° C. The DRT was extracted from MC simulations modeling mismatch around a typical process corner for the entire range of temperatures. To start, the indicator cells and signatures were extracted from the simulation at room temperature (25° C.). Subsequently, this signature was compared to the signature obtained at each of the other temperatures using the previously found indicator cells. Similar to the definition used above, any cell with a '0' or '1' quantification that was found to be different than at the nominal temperature was considered an error.

Figure 10:
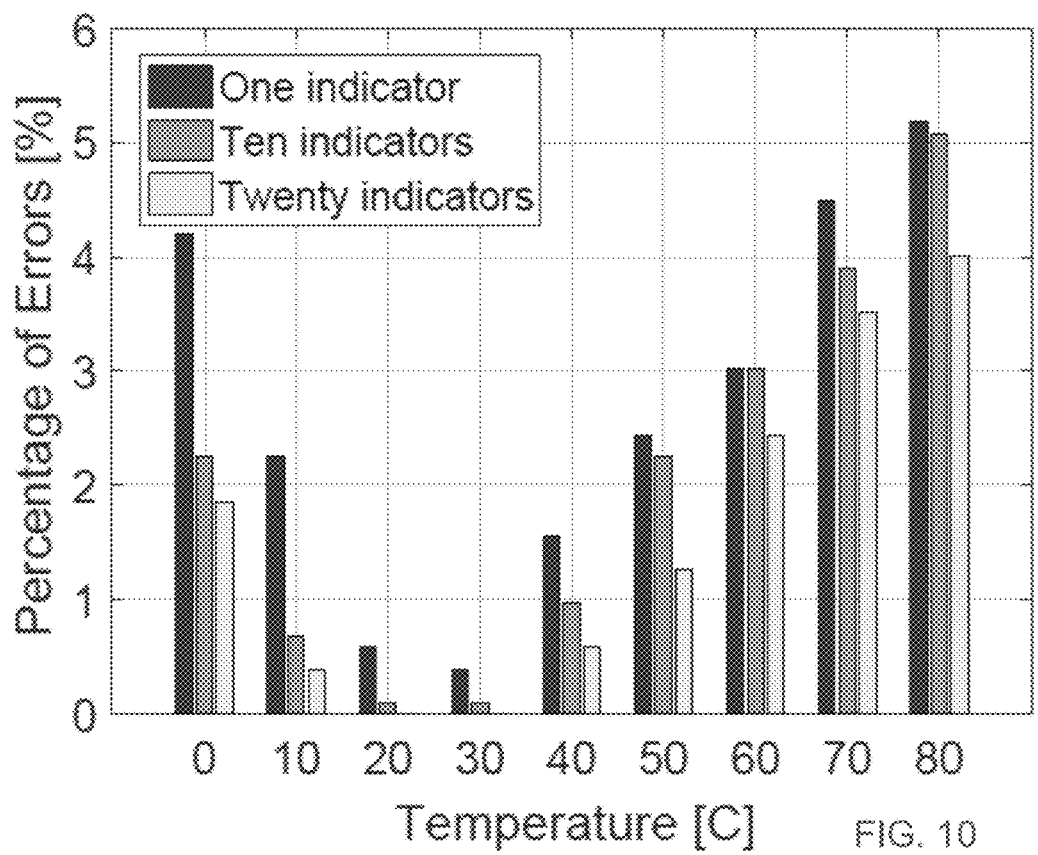
FIG. 10 is an illustration of the simulation results, showing the percentage of erroneous cells at each temperature (in comparison to room temperature conditions) for one, ten, and twenty indicator cells.
Figure 12A:
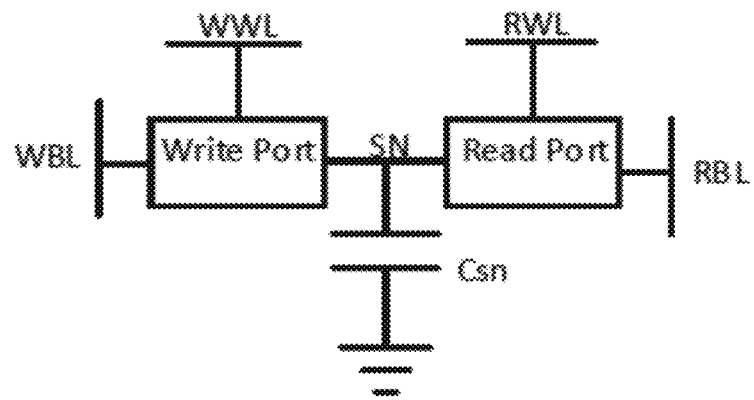
FIGS. 12A-12E are five examples of GC-eDRAM implementations that include between 1T-4T bitcells implemented with either NMOS/PMOS devices or combinations of both.
Figure 12B:
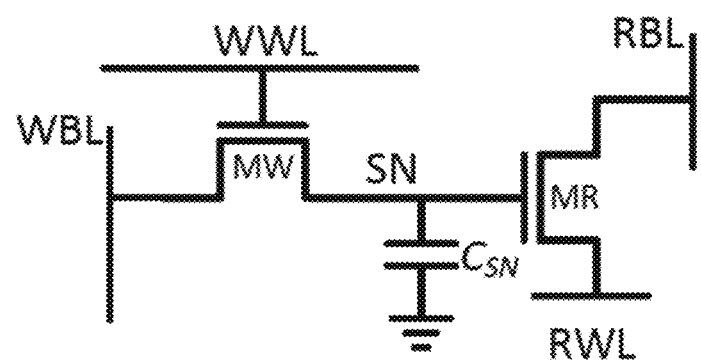
Figure 12C:
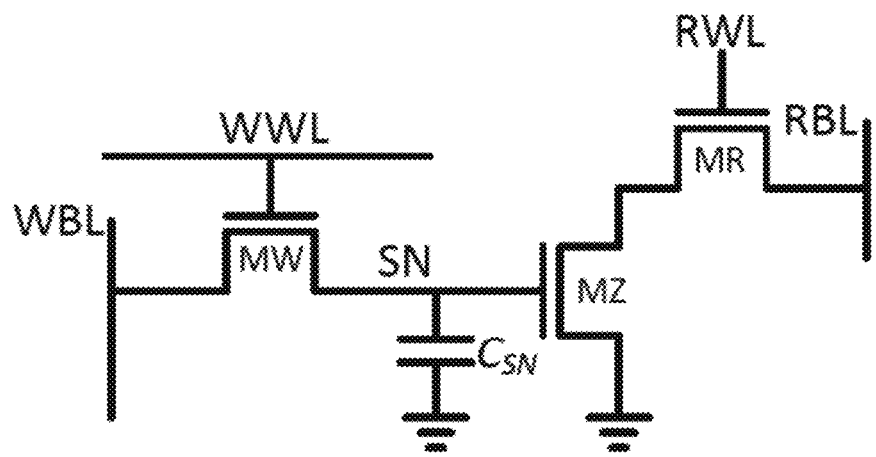
Figure 12D:
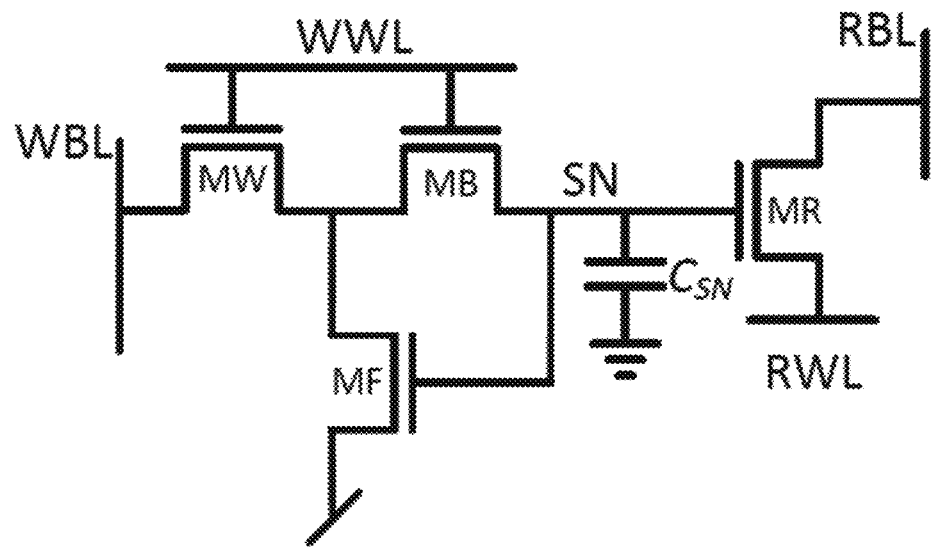
Figure 12E:
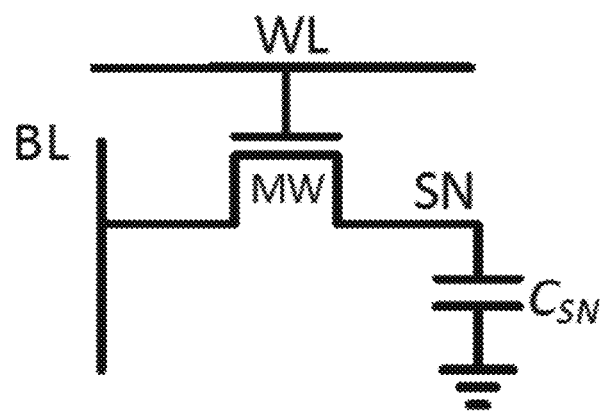

FIG. 10 presents the simulation results, showing the percentage of erroneous cells at each temperature (in comparison to room temperature conditions) for one, ten, and twenty indicator cells. The maximum numbers of errors for a single indicator cell was found to be 60, which is less than 6% of the array capacity. However, the number of errors decreases as the number of indicator cells increases, with 55 and 49 errors at 85° C. for ten and twenty indicator cells, respectively. As before, the errors can be attributed to the dependency of the leakage components on the temperature. Specifically, variation in the $V_T$ of write transistors between cells, and the increase in $I_{sub}$ with temperature, may lead to a more significant reduction in the DRT of cells compared to the DRT of the indicator cell, given that the write transistors in these cells have a lower $V_T$ than the write transistor in the indicator cell. As a result, the quantification of these cells may change during enrollment, leading to errors. Nonetheless, by eliminating the unstable cells, the same signature can be obtained throughout the entire temperature and voltage range.

Aging:

The main failure mechanism that causes SRAM-based PUFs startup values to change over time is negative bias temperature instability (NBTI), which results in $V_T$ increase of PMOS devices. Several works suggested exploiting this phenomena to reinforce the preferred values of the bi-stable elements in the PUF after manufacturing. However, this dependence also makes the SRAM-based PUFs more susceptible to malicious attacks, in which an attacker may perform stress on the SRAM cells after startup, thus increasing the number of unreliable cells. The proposed 2T GC-eDRAM PUF does not suffer from this drawback due to its pure NMOS structure.

The main aging mechanisms that affect NMOS devices are hot carrier injection (HCI) and positive bias temperature instability (PBTI), which becomes dominant in high-k dielectrics based process technologies. PBTI causes an increase in the $V_T$ on NMOS devices due to electron trapping in the high-k dielectric layer, which forms the gate oxide. For the considered 2T GC-eDRAM, an increase in the $V_T$ of the read transistor would result in a longer read access time; however, it would not affect the DRT of the cell, which determines the PUF signature. PBTI degradation of the write transistor may lead to a longer DRT since the sub-$V_T$ leakage is reduced due to the increase in $V_T$. However, this effect highly depends on the write access pattern to the cell, as the WWL is driven to $V_{DD}$ only during a write access.

HCI occurs when a high electric field is present near the drain junction region, which leads to trapped electrons in the gate oxide layer, and results in an increase in $V_T$. As in the case of PBTI, the effect of HCI on the read transistor does not affect the PUF evaluation. On the other hand, the increase in $V_T$ of the write transistor will result in a longer DRT due to reduced leakage from SN. Since HCI depends on the electric field applied on the transistors, its effect on the DRT of the cells highly depends on the write and read access statistics to the memory.

The increase in the DRT of the cells due to aging may lead to longer enrollment and evaluation stages. However, the effect on the PUF signature is minimal since the proposed authentication scheme calibrates the memory indicators during every enrollment stage. Therefore, the change in the DRT of the cells does not affect the final PUF signature.

Comparison

The invention proposes the first logic-compatible dynamic memory based PUF implementation. As such, it can only be compared with PUF implementations based on other design approaches. The table in FIG. 11 shows a comparison between the proposed GC-eDRAM based PUF and prior art memory-based PUFs, including SRAM and DRAM. The proposed GC-eDRAM has a bitcell area of 0.174 μm$^2$, which is 50% smaller than that of an SRAM based PUF in the same technology node. While 1T-1C Embedded DRAM has the smallest bitcell area, it is not logic-compatible, requiring a complex capacitor fabrication process, and in addition, suffers from destructive read due to charge sharing operation. The proposed GC-eDRAM based PUF achieves an optimal biasing of 50% using its unique authentication scheme, as well as 50% average uniqueness.

Under the tested voltage range, it provides the lowest BER of only 5.2% for a single indicator cell, and 1.5% for twenty indicator cells. Under the tested temperature range, the BER was found to be 5.8% for a single indicator cell, and 4.8% for twenty indicator cells, which is the lowest among the compared memory-based PUFs.

The enrollment time of the proposed scheme is only a few micro-seconds due to the short DRT of GC-eDRAM. In comparison, the SRAM-type PUF suffers from long enrollment times due to long power-off states prior to enrollment, while the DRAM-based PUF suffers from a long enrollment time due to a target DRT of several tens of micro-seconds. Furthermore, the proposed GC-eDRAM solution has low sensitivity to aging thanks to the indicator calibration process done during every enrollment stage. In comparison, SRAM-based PUFs suffer from high aging sensitivity caused by the change in the $V_T$ of PMOS devices in the cell, which can alternate the start-up value the cell. In addition, DRAM and SRAM prior art PUFs are typically vulnerable to non-invasive and semi-invasive attacks, such as data snooping and physical invasion. In contrast, the proposed GC-eDRAM-based PUF is resilient to these attacks, since it relies on the DRT of GC-eDRAM cells, which cannot be extracted using noninvasive or semi-invasive attacks.

Reference is also made to FIGS. 12A-12E, which are five examples of GC-eDRAM implementations that include between 1T-4T bitcells implemented with either NMOS/PMOS devices or combinations of both.

CONCLUSIONS

The invention proposes using the DRT characteristics of logic-compatible GC-DRAM arrays as a source for PUF signature extraction. GC-eDRAM is a high-density and low-power embedded memory alternative to SRAM, and therefore it can be used as an intrinsic PUF, without requiring additional area overhead. The proposed authentication methodology exploits the random nature of the DRT of GC-eDRAM cells due to process variations, and provides a highly unique and unbiased signature. The authentication technique is composed of an enrollment stage, which finds the DRT failures of cells that reside in the middle of the DRT range of the array. These cells are selected as indicator cells, and their DRT is used to set the sampling time of the array to provide an unbiased PUF signature. Monte Carlo analysis, including process variations and mismatch, as well as a wide voltage and temperature variation range, show that the proposed PUF suffers from less than 6% error-rate when a single indicator is used, and less than 5% when multiple indicators are selected.

The invention claimed is:

1. A method comprising:
   initializing bits of cells of a logic-compatible gain-cell embedded DRAM (dynamic random-access memory) (GC-eDRAM) array of a transistor circuit to a first logic value;
   causing bits of a portion of the cells of said array to change to a second logic value;
   continuously sampling the bits of the cells to determine which bits of the cells changed to said second logic value and have exceeded their data retention time (DRT), and for at least one row of said array, defining an indicator bit as a bit whose change to said second logic value occurred when at least 50% of the bits of the cells of said array have changed to said second logic value;
   re-initializing the bits of the cells of said array to said first logic value and causing bits of a selected portion of the cells of said array that includes said at least one row of said array to change to said second logic value; and
   continuously sampling the bits of the cells of said at least one row of said array until obtaining an indication that said indicator bit of said at least one row of said array has changed to said second logic value and using said indication as a physical unclonable function (PUF) signature of said circuit.

2. The method according to claim 1, wherein the steps of causing bits to change to said second logic value is done by write operations.

3. The method according to claim 1, wherein the steps of causing bits to change to said second logic value is done by increasing cell leakage.

4. The method according to claim 1, wherein said first logic value is '1' and said second logic value is '0'.

5. The method according to claim 1, wherein said at least one row of said array comprises only one row, and said indicator bit changing to said second logic value occurs when exactly 50% of the bits of the cells of said array have changed to said second logic value.

6. The method according to claim 1, wherein said PUF signature is based on the DRT of every cell in the array, which cannot be extracted without knowledge of exact operating conditions and intrinsic characteristics of said array.

7. The method according to claim 1, wherein said array comprises a logic-compatible GC-eDRAM array.

8. The method according to claim 1, wherein for the cells of the array, a parasitic capacitance is charged or discharged during said write operations.

* * * * *